(12) United States Patent
Shukla et al.

(10) Patent No.: US 11,468,949 B2
(45) Date of Patent: Oct. 11, 2022

(54) TEMPERATURE-DEPENDENT OPERATIONS IN A MEMORY DEVICE

(71) Applicant: Micron Technology, Inc., Boise, ID (US)

(72) Inventors: Pitamber Shukla, Boise, ID (US); Giuseppina Puzzilli, Boise, ID (US); Niccolo' Righetti, Boise, ID (US); Scott A. Stoller, Boise, ID (US); Priya Venkataraman, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 29 days.

(21) Appl. No.: 17/200,607

(22) Filed: Mar. 12, 2021

(65) Prior Publication Data

US 2022/0293184 A1    Sep. 15, 2022

(51) Int. Cl.
| | | |
|---|---|---|
| *G11C 11/00* | (2006.01) | |
| *G11C 16/10* | (2006.01) | |
| *G11C 7/04* | (2006.01) | |
| *G11C 16/32* | (2006.01) | |
| *G11C 16/26* | (2006.01) | |

(52) U.S. Cl.
CPC ............... *G11C 16/10* (2013.01); *G11C 7/04* (2013.01); *G11C 16/26* (2013.01); *G11C 16/32* (2013.01)

(58) Field of Classification Search
CPC ......... G11C 16/10; G11C 16/26; G11C 16/32; G11C 7/04
See application file for complete search history.

(56) References Cited

U.S. PATENT DOCUMENTS

| | | | | |
|---|---|---|---|---|
| 9,001,579 B2* | 4/2015 | Song | ........................ | G11C 7/04 365/185.23 |
| 9,786,336 B2* | 10/2017 | Woo | ................... | G11C 11/40626 |
| 11,200,939 B1* | 12/2021 | Rehmeyer | ......... | G11C 11/40607 |

* cited by examiner

*Primary Examiner* — Pho M Luu
(74) *Attorney, Agent, or Firm* — Nicholson De Vos Webster & Elliott LLP

(57) ABSTRACT

A method and system for temperature-dependent operations in a memory device are described. Temperature measurements of a memory device are recorded. A determination that a temperature measurement of the memory device satisfies a threshold temperature value is performed. In response to the determination, execution of a background operation in the memory device is delayed, and host system operation(s) continue to be executed in the memory device while execution of the background operation is delayed.

20 Claims, 4 Drawing Sheets

TEMPERATURE-DEPENDENT OPERATIONS IN A MEMORY DEVICE

TECHNICAL FIELD

The present disclosure generally relates to operations in a memory device, and more specifically, relates to temperature-dependent operations in a memory device.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
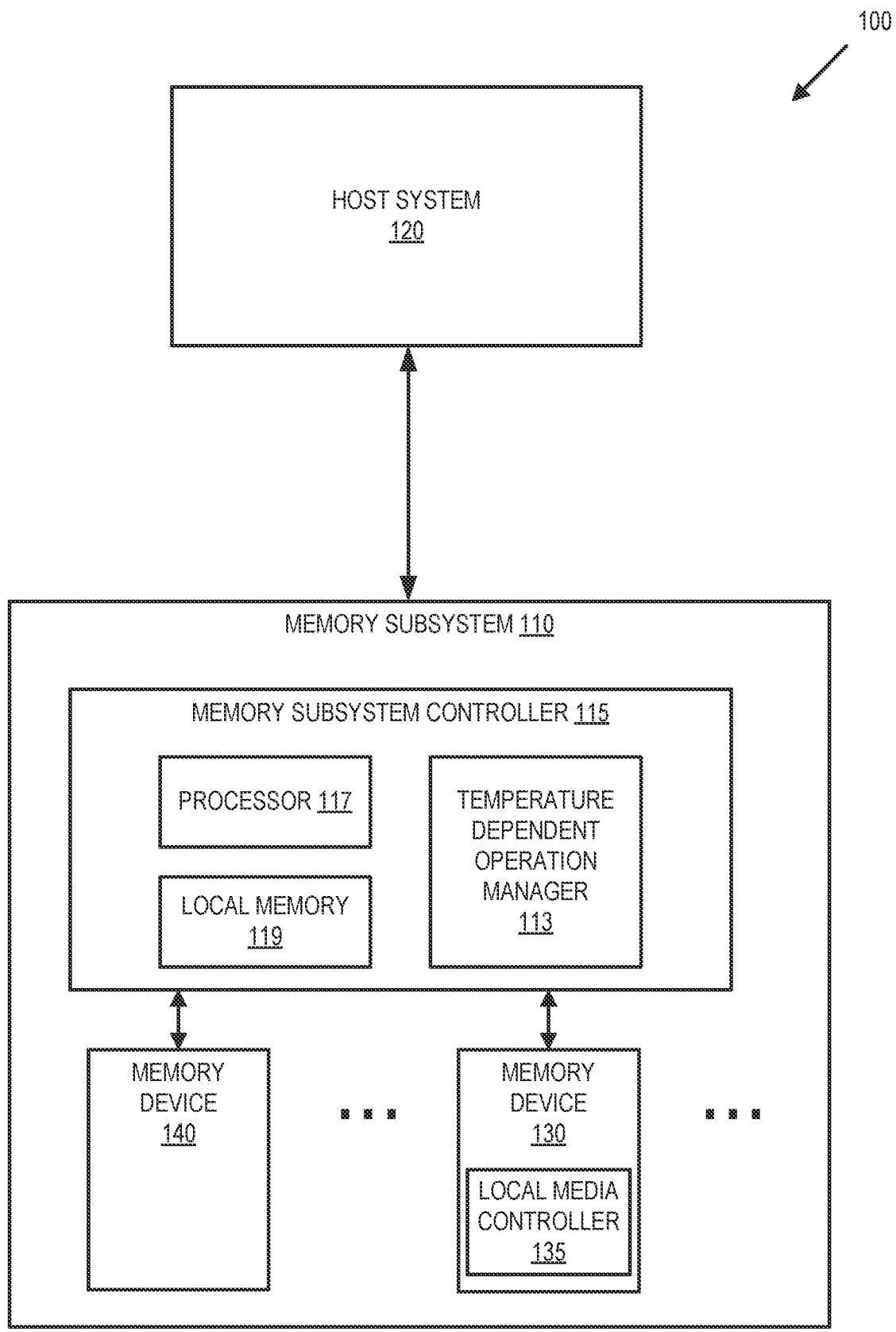
FIG. 1 illustrates an example computing system that includes a memory subsystem in accordance with some embodiments of the present disclosure.

Aspects of the present disclosure are directed to temperature-dependent operations in a memory device. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit/component that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states (e.g., "0" and "1").

The operating temperature of a memory device can vary. As such, operations in a memory device can be performed when the memory device is at different temperatures. Operations performed at high temperature can lead to higher error rates and more channel degradation resulting in an overall lower performance of the memory device. For example, a program/erase cycling performed in a memory device at a high temperature, such as 90 degrees C., is harder on the memory device(s) than when the cycling is performed at a lower temperature, such as 25 degrees C. Increased Cross-Temperature error rates are seen as a result.

Aspects of the present disclosure address the above and other deficiencies by managing the execution of background operations based on temperature measurements of the memory device. The background operations are delayed when the temperature measurement of the memory device is determined to be higher than or otherwise satisfy a threshold temperature value, while the host system operations can continue to be processed. The background operations resume execution when the temperature measurement of the memory device falls below the threshold temperature value or otherwise satisfies another temperature threshold. Using this scheme, the background operations can prepare blocks or other portions of memory for future host write requests, e.g., by performing background erase and program operations at temperatures below the threshold temperature. As a result, embodiments mitigate the effect of the temperature on errors for the memory device. The embodiments herein improve the overall raw bit error rate (RBER) for the memory device and cross temperature trigger rate, which improves the performance of the memory device.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a temperature-dependent operation manager 113 that manages execution of operations according to temperature measurements of a memory device. In some embodiments, the controller 115 includes at least a portion of the temperature-dependent operation manager 113. For example, the controller 115 can include a processor 117 (processing device) configured to execute instructions stored in local memory 119 for performing the operations described herein. In some embodiments, a temperature-dependent operation manager 113 is part of the host system 110, an application, or an operating system.

The temperature-dependent operation manager 113 can manage execution of background operations and host system operations. The temperature-dependent operation manager 113 can delay execution of background operations while continuing execution of host system operations in the memory device based upon the current operating temperature of the memory subsystem 110 or individual memory device(s) 130. The temperature-dependent operation manager 113 can resume execution of the background operations based on temperature measurements of the memory subsystem 110 or memory device(s) 130. Further details with regards to the operations of the temperature-dependent operation manager 113 are described below.

Figure 2:
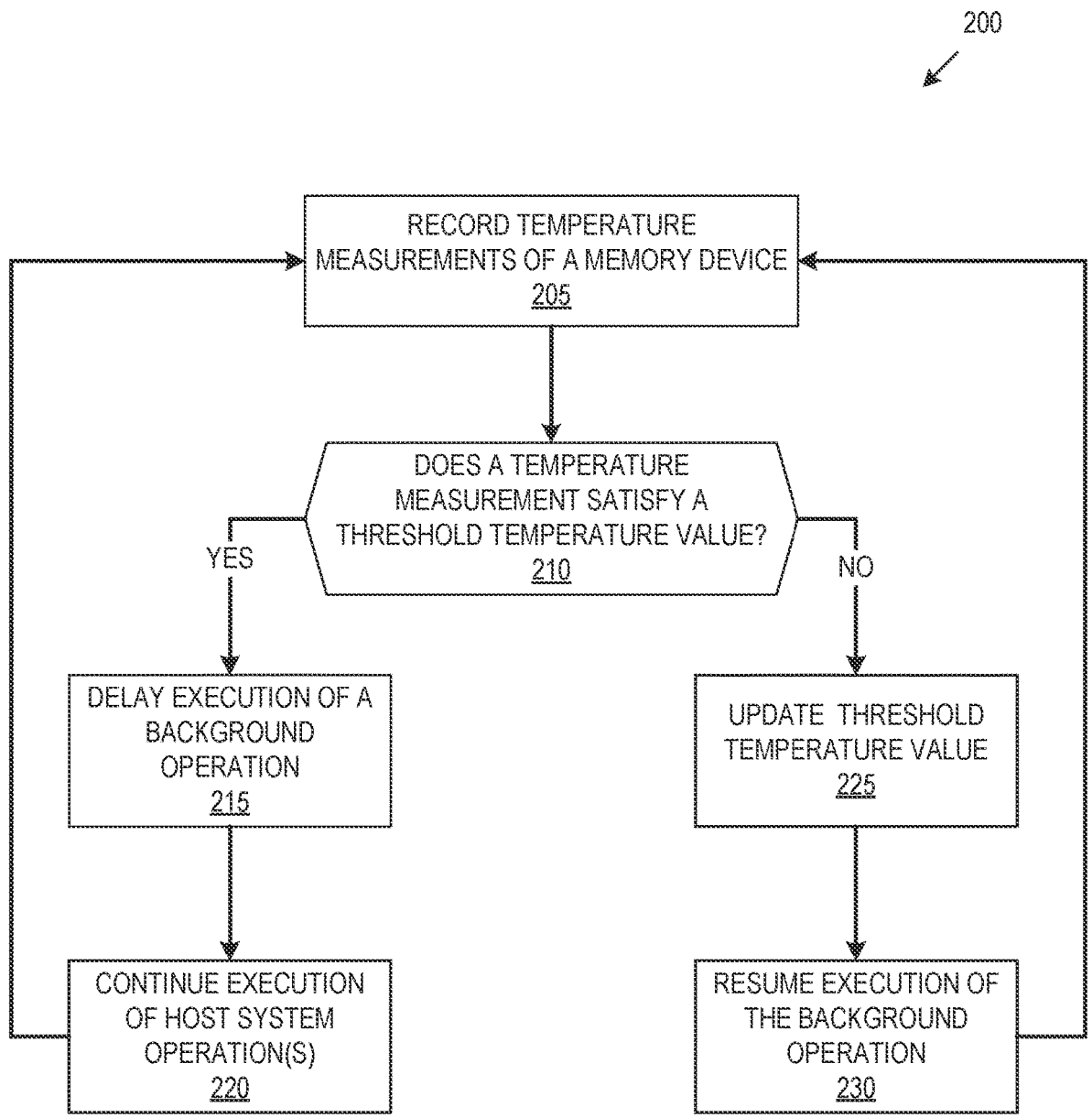
FIG. 2 is a flow diagram of an example method to manage execution of operations in a memory device based on temperature measurements, in accordance with some embodiments of the present disclosure.

FIG. 2 is a flow diagram of an example method to manage execution of operations in a memory device based on temperature measurements, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the temperature-dependent operation manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the processing device records one or more temperature measurements of a memory device. For example, the temperature-dependent operation manager 113 can record one or more temperature measurements of the memory subsystem 110 or the memory device(s) 130 and/or memory device(s) 140. The memory subsystem 110 includes one or more temperature sensors to generate temperature measurements of the memory subsystem 110 and/or memory device(s) 130/140. In one embodiment, a temperature sensor for a memory subsystem 110 provides a temperature measurement for one or more memory devices 130/140. Alternatively, each memory device 130/140 can include an independent temperature sensor, which provides individualized temperature measurements.

Recording one or more temperature measurements can include receiving the temperature measurements from a temperature sensor and storing the temperature measurements for the memory device. In one embodiment, the processing device requests or receives temperature measurements at a predetermined frequency. While embodiments are described with a single memory device, in some embodiments, temperature measurements can be received from multiple memory devices. Each set of temperature measurements is associated with the corresponding memory device from the multiple memory devices.

At operation 210, the processing device determines whether a temperature measurement of the memory device satisfies a threshold temperature value. The processing device determines whether a temperature measurement of the memory device satisfies a threshold temperature value by comparing the temperature measurement with the threshold temperature value and determining if the temperature measurement is higher than, lower than, or equal to the threshold temperature value. In some embodiments, a temperature measurement satisfies the threshold temperature value when it is strictly higher than the threshold temperature value; and the temperature measurement does not satisfy the threshold temperature value when it is lower than or equal to the threshold temperature value. In some embodiments, a temperature measurement satisfies the threshold temperature value when it is higher than or equal to the threshold temperature value; and the temperature measurement does not satisfy the threshold temperature value when it is strictly lower than the threshold temperature value.

While embodiments are described with individual temperature measurements being compared with the threshold temperature value, several temperature measurements can be used for determining if the threshold temperature is satisfied. For example, several temperature values recorded over a period of time, such as successive temperature values, can be each compared with the threshold temperature value. The threshold temperature value is satisfied when multiple ones of the several temperature values (e.g., a subset of the several temperature values) satisfy the threshold temperature value. Alternatively, or additionally, the threshold temperature value is satisfied when an average of the several temperature values satisfies the threshold. The average can be a mean of temperature measurements, a median of the temperature measurements, a rolling average of the temperature measurements, etc. Additional or alternative methods can be used for determining that the threshold temperature is satisfied based on the recorded temperature measurement(s) without departing from the scope of the embodiments described herein.

When the processing device determines that the temperature measurement of the memory device satisfies the threshold temperature value, the method proceeds to operations 215-220. When the processing device determines that the temperature measurement of the memory device does not satisfy the threshold temperature value, the method proceeds to operations 225-230.

In some embodiments, the threshold temperature value can be a predetermined value for a memory device or a class of memory devices. For example, the predetermined threshold temperature value can be set based on one or more experimental use of the memory device. For example, a set of operations (e.g., erase operation and/or program operation) can be performed in a memory device at different temperatures. The operations can be performed when the memory device's temperature is at a higher temperature (e.g., 90 degrees C., 85 degrees C., etc.). Operations can be performed when the memory device's temperature is at a second temperature (e.g., 25 degrees C., 20 degrees C., etc.). An analysis of an error rate for these operations when performed at the different temperatures can allow for the determination of a threshold temperature value. In some embodiments, the processing device records temperature measurements for an operating memory device at a given frequency. Using these temperature measurements, the processing device can determine an operating temperature range for the memory device. The threshold value is determined from the temperature range. For example, the threshold temperature value can be the lowest possible temperature under which the memory device can operate. In some embodiments, the threshold value can be determined dynamically. For example, the threshold temperature value can be regularly updated based on recorded temperature measurements for the memory device. In one non-limiting example, one or more temperature measurements that are lower than other temperature measurements recorded over an interval of time can be used to generate and/or update the threshold temperature value. This operation can be repeated at regular intervals to update the threshold temperature value.

At operation 225, the processing device updates the threshold temperature value when applicable. In one embodiment, the processing device updates the temperature threshold value based on a series of temperature measurements. For example, the processing device can retain a history of temperature measurements and update the threshold temperature value if the average operating temperature is less than or greater than an expected operating temperature by a standard deviation amount or other variance threshold. In one embodiment, the processing device updates the threshold temperature value in a predetermined incremental amount. In another embodiment, the processing device updates the threshold temperature value in an amount that is proportional to how much the temperature history varies from the expected operating temperature. The processing device can use other statistical analyses of temperature measurements to dynamically adjust the threshold temperature value (e.g., based upon historical minimum and maximum temperature measurements). In some embodiments, operation 225 is optional and may not be performed.

At operation 215, the processing device delays execution of a background operation in the memory device. A background operation is an operation to be executed in a memory device without receipt of a request for that operation from the host system 130. For example, a background operation can be initiated by the memory subsystem controller 115 or the local media controller 135. A background operation can be a read operation, an erase operation, or a program operation. The background operation can be part of a garbage collection process, a folding process due to a scan for error rates, etc. The background operations can be part of a process for reconfiguration of a portion of a memory from a first memory cell bit density to a second memory cell bit density or to erase a portion of memory to free up memory for a pool of memory units. For example, the background operation can be for reconfiguring the memory from a SLC bit density to an MLC or TLC bit density. In another example, the reconfiguration can be for reconfiguring the memory from an MLC or TLC bit density to a SLC bit density.

When the temperature measurement satisfies the threshold temperature value, the processing device can delay execution of one or more background operations. The operation(s) can be a single operation (such as an erase or a program), multiple operations (such as erase and program), or another part of a process that is delayed. Delaying execution of a background operation can include stopping execution of an ongoing operation or delaying the start of the execution of a background operation. In one example, when the processing device determines that the temperature measurement satisfied the threshold temperature value, it can stop execution of a background operation that had already started execution in the memory device and delay the start of execution of another background operation. In another example, when the processing device determines that the temperature measurement satisfied the threshold temperature value, it only delays the start of execution of background operations and does not stop execution of an operation that has already started.

At operation 220, the processing device continues execution of one or more host system operations. The processing device continues to execute the host system operations while execution of the background operation is delayed to avoid latency or other quality of service issues with the host system. In some embodiments, the host system operations continue to be executed upon receipt. In some embodiments, the host system operations can be delayed before being executed for other reasons than satisfaction of a threshold temperature value.

At operation 230, the processing device resumes or continues execution of background operation(s). Resuming execution of a background operation includes continuing execution of a background operation that was stopped earlier. Resuming execution of a background operation can include starting execution of a background operation that was not executed before. In one embodiment, the temperature threshold value used for resuming the execution of background operations differs from the temperature threshold value used for delaying the execution of background operations.

Figure 3:
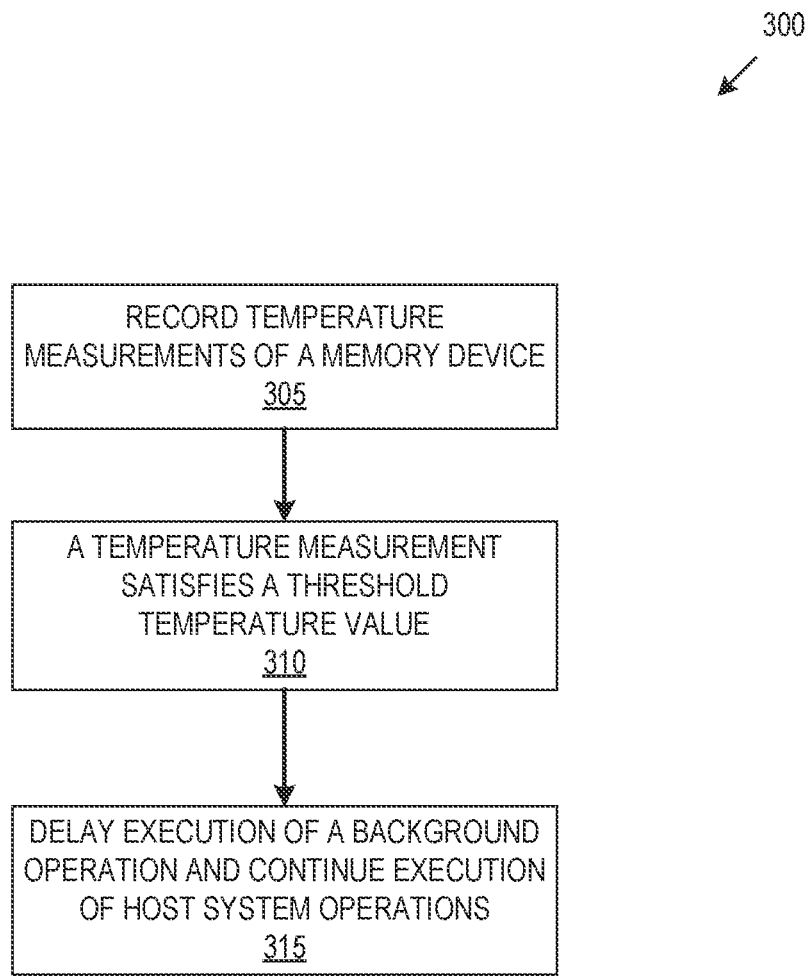
FIG. 3 is a flow diagram of another example method to manage execution of operations in a memory device based on temperature measurements, in accordance with some embodiments of the present disclosure.

FIG. 3 is a flow diagram of another example method to manage execution of operations in a memory device based on temperature measurements, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the temperature-dependent operation manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device records one or more temperature measurements of a memory subsystem or memory device. For example, the processing device can record temperature measurements similar to operation 205 described above.

At operation 310, the processing device determines that a temperature measurement of the memory device satisfies a threshold temperature value. In some embodiments, the processing device determines that a temperature measurement of the memory device satisfies a threshold temperature value by comparing the temperature measurement with the threshold temperature value and determining that the temperature measurement is higher than or equal to the threshold temperature value. In some embodiments, the processing device determines that a temperature measurement of the memory device satisfies a threshold temperature value by comparing the temperature measurement with the threshold temperature value and determining it is strictly higher than the threshold temperature value. While embodiments are described with a temperature measurements compared with the threshold temperature value, several temperature measurements can be used for determining that the threshold temperature is satisfied. For example, several temperature values recorded over a period of time, such as successive temperature values, can be each compared with the threshold temperature value. The threshold temperature value is satisfied when multiple ones of the several temperature values (e.g., a subset of the several temperature values) satisfy the threshold temperature value. Alternatively or additionally, the threshold temperature value is satisfied when an average of the several temperature values satisfies the threshold. The average can be a mean of temperature measurements, a median of the temperature measurements, a rolling average of the temperature measurements, etc. The method proceeds to operations 315.

At operation 315, in response to determining that the temperature measurement of the memory device satisfies the threshold temperature value, the processing device delays execution of a background operation in the memory device, and continues execution of one or more host system operations in the memory device while the background operation is delayed.

Figure 4:
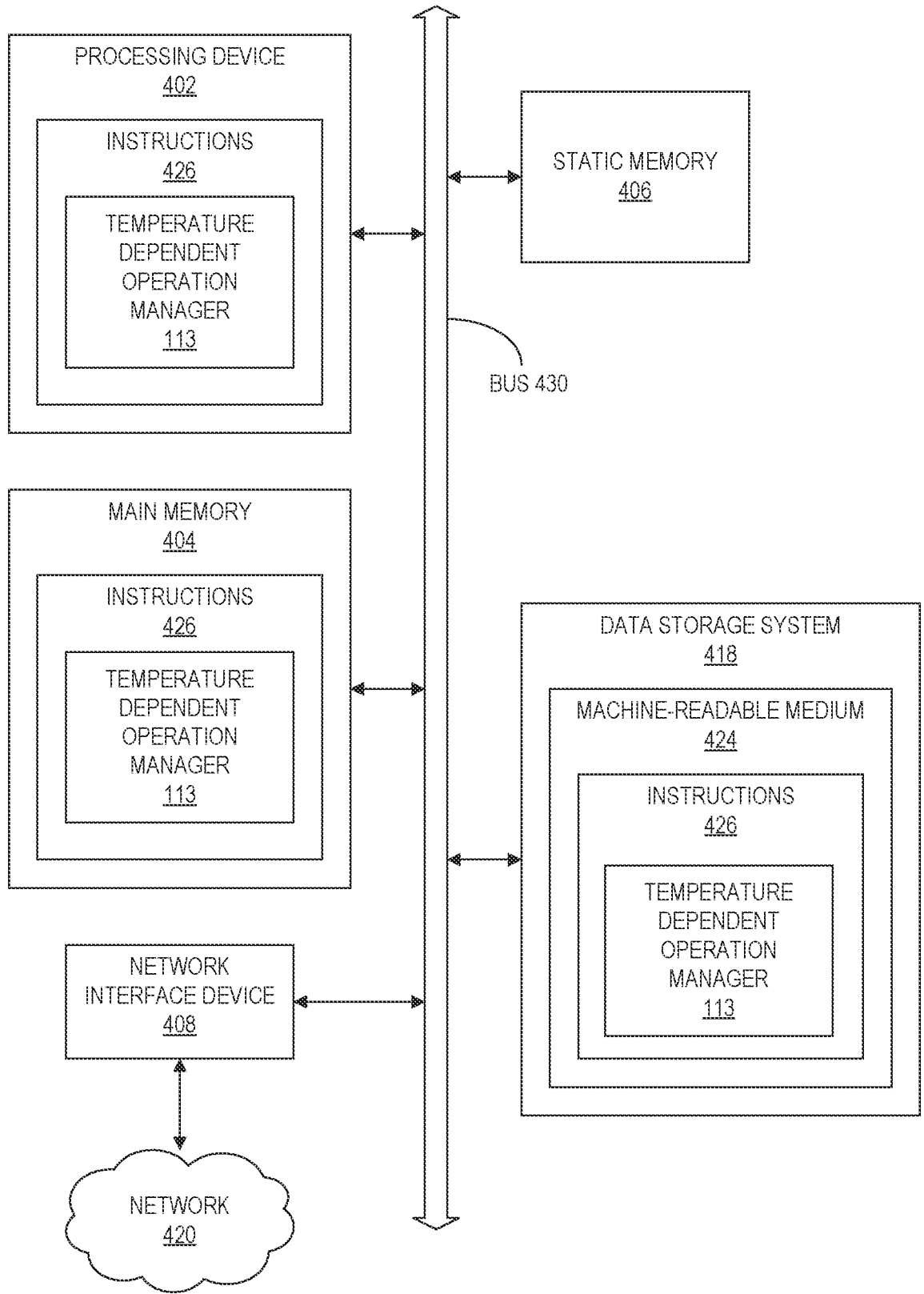
FIG. 4 is a block diagram of an example computer system in which embodiments of the present disclosure may operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the temperature-dependent operation manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory subsystem 110 of FIG. 1.

In one embodiment, the instructions 426 include instructions to implement functionality corresponding to a temperature-dependent operation manager (e.g., the temperature-dependent operation manager 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium"

shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented method(s) 200, and 300 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    recording one or more temperature measurements of a memory device;
    determining that a temperature measurement of the memory device satisfies a threshold temperature value; and
    in response to determining that the temperature measurement of the memory device satisfies the threshold temperature value, delaying execution of a background operation in the memory device, wherein one or more host system operations in the memory device continue to be executed while execution of the background operation is delayed.

2. The method of claim 1, further comprising:
    determining that another temperature measurement of the memory device does not satisfy the threshold temperature value; and
    in response to determining that the other temperature of the memory device does not satisfy the threshold temperature value, resuming execution of the background operation.

3. The method of claim 1, further comprising:
    updating the threshold temperature value based on a plurality of recorded temperature measurements of the memory device.

4. The method of claim 1, wherein the background operation is an erase operation.

5. The method of claim 1, wherein the background operation is a program operation.

6. The method of claim 1, wherein the background operation is part of a garbage collection process.

7. The method of claim 1, wherein the background operation is part of a process for reconfiguration of a portion of memory from a first memory cell bit density to a second memory cell bit density.

8. A non-transitory computer-readable storage medium comprising instructions that, when executed by a processing device, cause the processing device to:
    record one or more temperature measurements of a memory device;
    determine that a temperature measurement of the memory device satisfies a threshold temperature value; and
    in response to determining that the temperature measurement of the memory device satisfies the threshold temperature value, delay execution of a background operation in the memory device, wherein one or more host system operations in the memory device continue to be executed while execution of the background operation is delayed.

9. The non-transitory computer-readable storage medium of claim 8, wherein the processing device is further to:

determine that another temperature measurement of the memory device does not satisfy the threshold temperature value; and in response to determining that the other temperature of the memory device does not satisfy the threshold temperature value, resume execution of the background operation.

10. The non-transitory computer-readable storage medium of claim 8, wherein the processing device is further to:

update the threshold temperature value based on a plurality of recorded temperature measurements of the memory device.

11. The non-transitory computer-readable storage medium of claim 8, wherein the background operation is an erase operation.

12. The non-transitory computer-readable storage medium of claim 8, wherein the background operation is a program operation.

13. The non-transitory computer-readable storage medium of claim 8, wherein the background operation is part of a garbage collection process.

14. The non-transitory computer-readable storage medium of claim 8, wherein the background operation is part of a process for reconfiguration of a portion of memory from a first memory cell bit density to a second memory cell bit density.

15. A system comprising:
a memory device; and
a processing device, operatively coupled with the memory device, to:
record one or more temperature measurements of a memory device;
determine that a temperature measurement of the memory device satisfies a threshold temperature value;
in response to determining that the temperature measurement of the memory device satisfies the threshold temperature value, delay execution of a background operation in the memory device, wherein one or more host system operations in the memory device continue to be executed while execution of the background operation is delayed;
determine that another temperature measurement of the memory device does not satisfy the threshold temperature value; and
in response to determining that the other temperature of the memory device does not satisfy the threshold temperature value, resume execution of the background operation.

16. The system of claim 15, wherein the processing device is further to:

update the threshold temperature value based on a plurality of recorded temperature measurements of the memory device.

17. The system of claim 15, wherein the background operation is an erase operation.

18. The system of claim 15, wherein the background operation is a program operation.

19. The system of claim 15, wherein the background operation is part of a garbage collection process.

20. The system of claim 15, wherein the background operation is part of a process for reconfiguration of a portion of memory from a first memory cell bit density to a second memory cell bit density.

\* \* \* \* \*